(12) United States Patent
Xiao

(10) Patent No.: US 12,392,558 B2
(45) Date of Patent: Aug. 19, 2025

(54) WATER-COOLING HEAT DISSIPATION DEVICE

(71) Applicant: SHENZHEN APALTEK CO., LTD., Shenzhen (CN)

(72) Inventor: Qineng Xiao, Guangdong (CN)

(73) Assignee: SHENZHEN APALTEK CO., LTD., Shenzhen (CN)

( * ) Notice: Subject to any disclaimer, the term of this patent is extended or adjusted under 35 U.S.C. 154(b) by 231 days.

(21) Appl. No.: 18/204,186

(22) Filed: May 31, 2023

(65) Prior Publication Data

US 2024/0077258 A1 Mar. 7, 2024

(30) Foreign Application Priority Data

Jun. 2, 2022 (CN) .......................... 202221369857.7

(51) Int. Cl.
| | |
|---|---|
| *F28D 15/00* | (2006.01) |
| *F28F 9/00* | (2006.01) |
| *H01L 23/473* | (2006.01) |
| *H05K 7/20* | (2006.01) |
| *F28D 21/00* | (2006.01) |

(52) U.S. Cl.
CPC .............. *F28D 15/00* (2013.01); *F28F 9/005* (2013.01); *F28D 2021/0028* (2013.01); *F28F 2250/08* (2013.01); *H01L 23/473* (2013.01); *H05K 7/20272* (2013.01)

(58) Field of Classification Search
CPC ...... H05K 7/20272; F28D 15/00; F28F 9/005; F28F 2250/08; H01L 23/473
See application file for complete search history.

(56) References Cited

U.S. PATENT DOCUMENTS

| | | |
|---|---|---|
| 6,019,165 A | 2/2000 | Batchelder |
| 6,894,899 B2 | 5/2005 | Wu et al. |
| 6,915,653 B2 | 7/2005 | Nakano et al. |
| 7,325,591 B2 | 2/2008 | Duan et al. |
| 8,240,362 B2 | 8/2012 | Eriksen |
| 8,245,764 B2 | 8/2012 | Eriksen |
| 10,078,354 B2 | 9/2018 | Eriksen |

(Continued)

FOREIGN PATENT DOCUMENTS

JP 2002151638 A 5/2002

*Primary Examiner* — Paul Alvare
(74) *Attorney, Agent, or Firm* — Chun-Ming Shih; hdls ipr services

(57) ABSTRACT

A liquid-cooling heat dissipation device includes a liquid cooler, a pump assembly, a liquid input connector, and a liquid output connector. The liquid cooler includes a seat and a heat absorbing structure connected with the seat. The heat absorbing structure includes a heat exchanging chamber defined therein. The seat includes a liquid supplying channel communicating with the heat exchanging chamber. A liquid storage room is defined in the liquid supplying channel. The pump assembly includes a base and a pump fixed on the base. The base is flatly attached on the seat and includes a pump accommodating groove and a liquid draining hole. The pump includes an impeller accommodated in the pump accommodating groove. The liquid draining hole communicates with the liquid storage room. The liquid input connector communicates with the liquid supplying channel. The liquid output connector communicates with the pump accommodating groove.

7 Claims, 12 Drawing Sheets

(56) References Cited

U.S. PATENT DOCUMENTS

| | | | |
|---|---|---|---|
| 10,078,355 | B2 | 9/2018 | Eriksen |
| 10,599,196 | B2 | 3/2020 | Eriksen |
| 10,613,601 | B2 | 4/2020 | Eriksen |
| 2006/0185829 | A1 | 8/2006 | Duan et al. |
| 2006/0185830 | A1 | 8/2006 | Duan |
| 2017/0347487 | A1* | 11/2017 | Rudnicki ................ F28F 13/12 |
| 2020/0185306 | A1* | 6/2020 | Xiao ..................... H01L 23/467 |
| 2020/0236807 | A1* | 7/2020 | Deng ...................... F28F 27/02 |
| 2021/0195797 | A1* | 6/2021 | Chen .................. H05K 7/20272 |
| 2021/0199391 | A1* | 7/2021 | Xiao ..................... F04D 29/606 |
| 2021/0307197 | A1* | 9/2021 | Chen .................. H05K 7/20772 |
| 2021/0385969 | A1* | 12/2021 | Geng ........................ G06F 1/20 |
| 2022/0373275 | A1* | 11/2022 | Mostafavi Yazdi .. F28F 9/0246 |
| 2022/0381516 | A1* | 12/2022 | Huang ................ F28D 1/05391 |
| 2022/0400578 | A1* | 12/2022 | Pan .................... H05K 7/20272 |
| 2023/0056832 | A1* | 2/2023 | Tsai ................... F04D 13/0606 |

\* cited by examiner

WATER-COOLING HEAT DISSIPATION DEVICE

BACKGROUND OF THE DISCLOSURE

Technical Field

The present disclosure relates to a heat dissipation device, particularly relates to a liquid-cooling heat dissipation device (or water-cooling heat dissipation device).

Description of Related Art

Following the continuous increasing of computing speed of the element, such as processor, etc., in the electronic product, the generated heat is also getting higher. That causes the general air-cooling heat dissipation device to be unable to meet the heat dissipation requirement at current stage. Therefore, the liquid-cooling heat dissipation device, which has the working liquid, such as water, etc., for circulation cooling function, needs to be used to effectively perform heat dissipation for the aforementioned electronic heating element.

The related-art liquid-cooling heat dissipation device resolves the problem of the air-cooling heat dissipation device. However, the related-art liquid-cooling heat dissipation device has following issues. The volume of the related-art liquid-cooling heat dissipation device is enormous, and the applicable range and field are limited. Some solutions are provided for the limitation, but the issues, such as insufficient water supply and insufficient service life, still need to be improved.

In view of this, the inventors have devoted themselves to the aforementioned related art, researched intensively try to solve the aforementioned problems.

SUMMARY OF THE DISCLOSURE

One purpose of the disclosure is to provide a liquid-cooling heat dissipation device, which makes the pump have sufficient liquid (or water) supply though the liquid draining hole and liquid storage room communicating with each other, and further increases the service life of the heat dissipation device.

In order to achieve the purpose, the disclosure provides a liquid-cooling heat dissipation device including a liquid cooler, a pump assembly, a liquid input connector, and a liquid output connector. The liquid cooler includes a seat and a heat absorbing structure connected with the seat. The heat absorbing structure includes a heat exchanging chamber defined therein. The seat includes a liquid supplying channel communicating with the heat exchanging chamber. A liquid storage room is defined in the liquid supplying channel. The pump assembly includes a base and a pump fixed on the base. The base is flatly attached on the seat and includes a pump accommodating groove and a liquid draining hole. The pump includes an impeller accommodated in the pump accommodating groove. The liquid draining hole is defined corresponding to and communicates with the liquid storage room. The liquid input connector is disposed on the base and communicates with the liquid supplying channel. The liquid output connector is disposed on the base and communicates with the pump accommodating groove.

In some embodiments, the base includes a liquid retaining room defined on an outer periphery of the liquid draining hole, and the liquid retaining room communicates with the liquid draining hole and the liquid storage room.

In some embodiments, the liquid-cooling heat dissipation device further includes a first sealing element, the pump includes a bearer fixed to the base correspondingly, and the first sealing element is sandwiched between the bearer and the base.

In some embodiments, the liquid-cooling heat dissipation device further includes a second sealing element, the seat includes an upper casing, and the second sealing element is sandwiched between the upper casing and the base.

In some embodiments, the liquid-cooling heat dissipation device further includes a third sealing element sandwiched between the seat and the base.

In some embodiments, the liquid-cooling heat dissipation device further includes a lighting board fixed on and electrically connected with the pump.

In some embodiments, the seat includes an upper casing and a bottom casing assembled with the upper casing correspondingly, and the liquid supplying channel is defined inside the upper casing and the bottom casing.

In some embodiments, the liquid supplying channel includes a liquid input channel, and the liquid input channel includes a liquid input hole defined on the upper casing, a first liquid input passage communicating with the liquid input hole and defined between the upper casing and the bottom casing, and a second liquid input passage communicating with the first liquid input passage and defined on the bottom casing.

In some embodiments, the liquid supplying channel includes a liquid output channel, and the liquid output channel includes a plurality of liquid output grooves defined on the bottom casing, a plurality of first liquid output passages respectively communicating with the liquid output grooves and defined between the upper casing and the bottom casing, and a plurality of liquid output holes respectively communicating with the first liquid output passages and defined on the upper casing.

In some embodiments, the liquid storage room communicates with the liquid output holes and is defined on a middle portion of the upper casing.

BRIEF DESCRIPTION OF THE DRAWINGS

The disclosure itself, however, may be best understood by reference to the following detailed description of the invention, which describes a number of exemplary embodiments of the invention, taken in conjunction with the accompanying drawings, in which.

DETAILED DESCRIPTION

The technical contents of this disclosure will become apparent with the detailed description of embodiments accompanied with the illustration of related drawings as follows.

It should be noted that, when being used in the specification and claims of the disclosure, the term, "comprise/include", indicates that the described feature, entirety, step, operation, element, and/or assembly is existed, but the adding or existence of one or more other feature, entirety, step, operation, element, assembly, and/or set is not excluded.

In order to make the figures be concise, each figure only schematically indicates the portion related to the disclosure and may not represent the practical structure as a product. Further, in order to make the figures be concise and easy understanding, when there are some elements with the same structure or function, some figures only schematically indicate or label one of the elements. In the description, "a/an" may not only indicate "only one", but in some conditions, that may also indicate "more than one".

It is worth mentioning that the term "and/or" used in the specification and claims indicates any combination and all possible combinations of the listed element, and further includes all the combinations.

It is intended that the embodiments and drawings disclosed herein are to be considered illustrative rather than restrictive.

Figure 1:
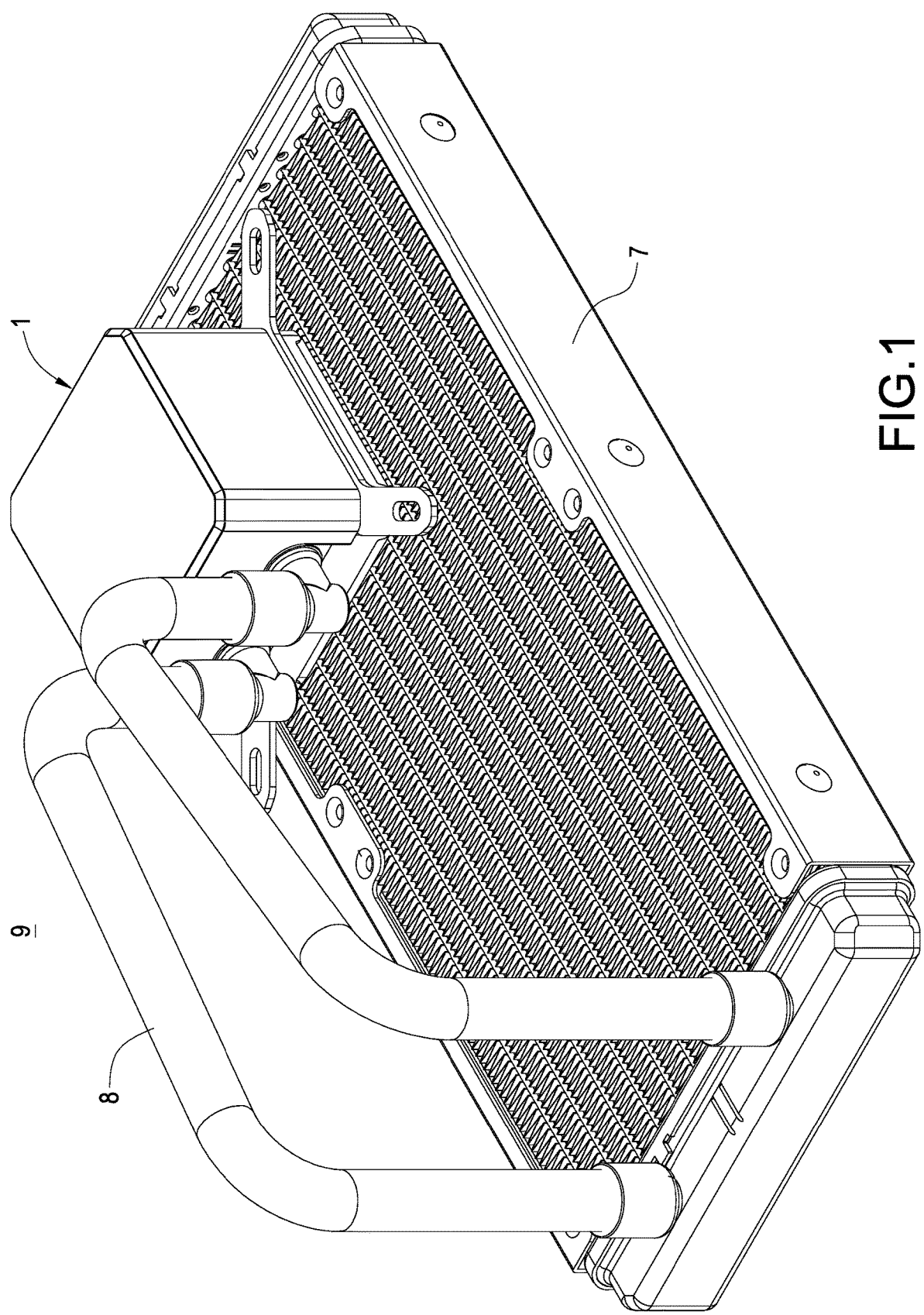
FIG. 1 is an assembled view of the liquid-cooling heat dissipation device of the disclosure applied in the heat dissipation system.
Figure 2:
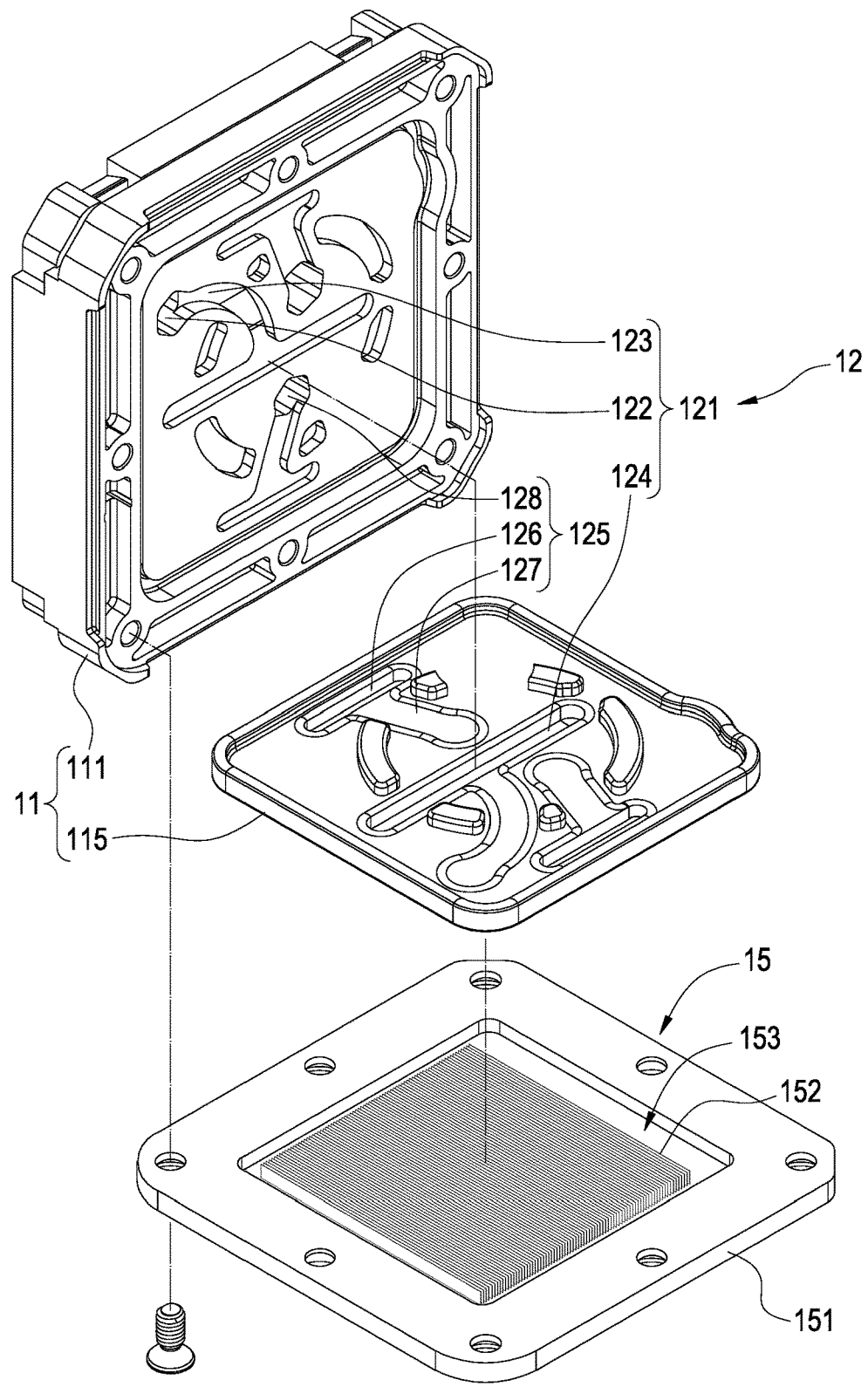
FIG. 2 is an exploded view of the liquid cooler of the disclosure.

Referring to FIG. 1, the disclosure provides a liquid-cooling heat dissipation device, which may be applied to a heat dissipation system 9. The heat dissipation system 9 mainly includes a liquid-cooling heat dissipation device 1, a liquid cooling composition 7, and two liquid conduits 8. Two ends of each liquid conduit 8 respectively communicate with the liquid-cooling heat dissipation device 1 and the liquid cooling composition 7.

Referring to FIG. 2 to FIG. 5, the liquid-cooling heat dissipation device 1 of the disclosure mainly includes a liquid cooler 10, a pump assembly 20, a liquid input connector 30, and a liquid output connector 40.

The liquid cooler 10 mainly includes a seat 11 and a heat absorbing structure 15. The seat 11 is substantially of a rectangular shape, and includes an upper casing 111 and a bottom casing 115 assembled with the upper casing 111 correspondingly. A liquid supplying channel 12 is defined inside the upper casing 111 and the bottom casing 115.

The liquid supplying channel 12 mainly includes a liquid input channel 121 and a liquid output channel 125. The liquid input channel 121 mainly includes a liquid input hole 122 defined on the upper casing 111, a first liquid input passage 123 communicating with the liquid input hole 122 and defined between the upper casing 111 and the bottom casing 115, and a second liquid input passage 124 communicating with the first liquid input passage 123 and defined on a middle portion of the bottom casing 115.

The liquid output channel 125 mainly includes two liquid output grooves 126 respectively defined on the side portions of the bottom casing 115, two first liquid output passages 127 respectively communicating with the liquid output grooves 126 and defined between the upper casing 111 and the bottom casing 115, and two liquid output holes 128 respectively communicating with the first liquid output passages 127 and defined on the upper casing 111.

The liquid supplying channel 12 on the upper casing 111 includes a liquid storage room 13. The liquid storage room 13 communicates with the liquid output hole 128 and defined on a middle portion of the upper casing 111.

The heat absorbing structure 15 is connected under the seat 11, and mainly includes a heat conduction plate 151 and a plurality of heat dissipation fins 152. The heat conduction plate 151 may be made of a material with desirable heat conductivity, such as copper, aluminum, or the alloy of copper and aluminum, etc. The heat conduction plate 151 has a heat exchanging chamber 153 defined therein. The heat dissipation fins 152 are arranged spacedly in the heat exchanging chamber 153. The second liquid input passage 124 and the liquid output grooves 126 respectively communicate with the heat exchanging chamber 153.

Figure 8:
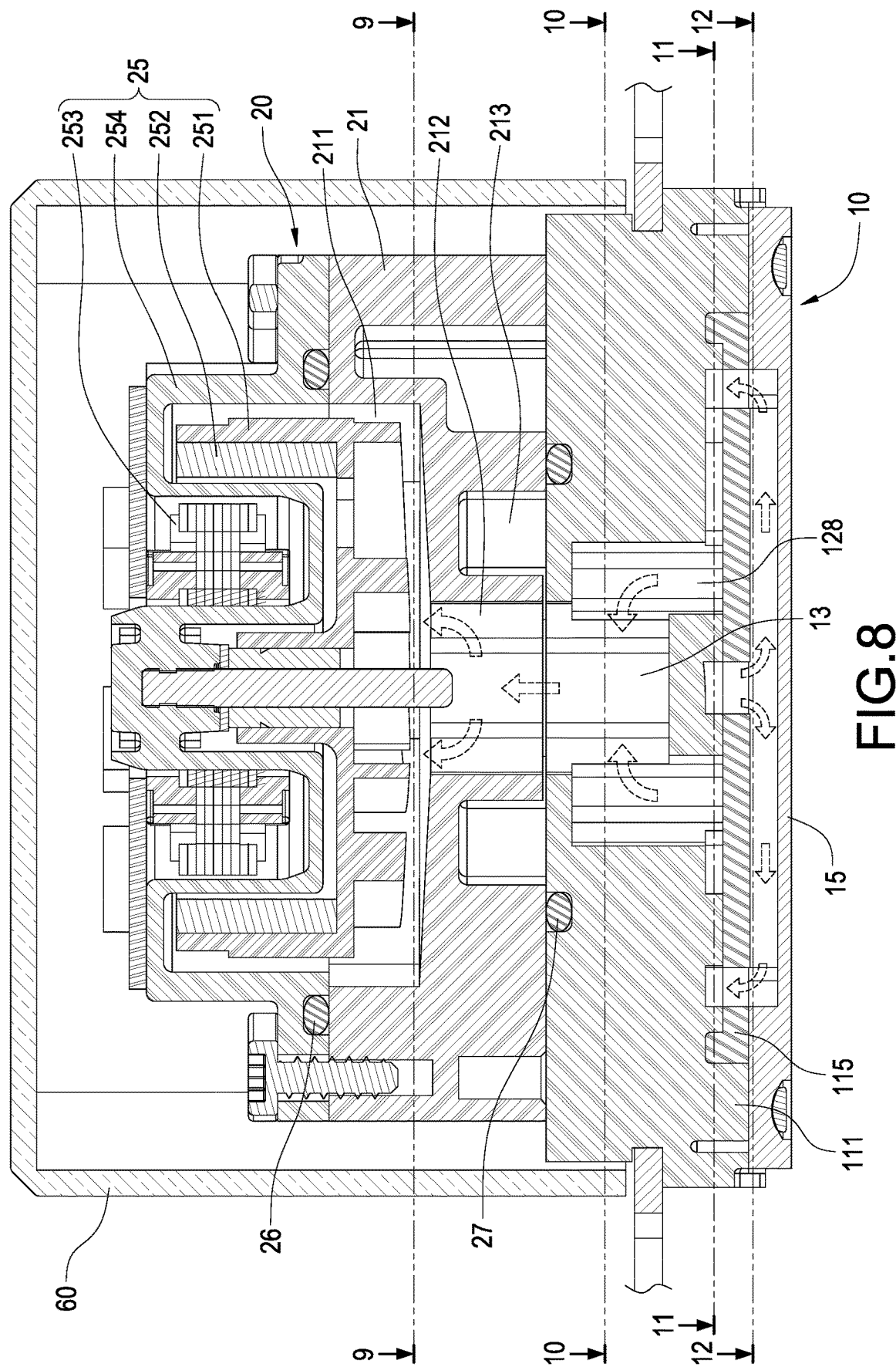
FIG. 8 is an assembled cross-sectional view of the liquid-cooling heat dissipation device of the disclosure.

Referring to FIG. 8, the pump assembly 20 mainly includes a base 21 and a pump 25. The base 21 is substantially of a rectangular shape and flatly attached above the seat 11. The base 21 includes a pump accommodating groove 211 and a liquid draining hole 212 communicating with the pump accommodating groove 211. The pump 25 mainly includes an impeller 251, a rotator 252, a stator 253, and a bearer 254. The bearer 254 is fixed corresponding to the base 21. The rotator 252 is fixed above the impeller 251, and the two are collectively disposed in the space enclosed by the bearer 254 and the base 21 (as shown in FIG. 8). The stator 253 is sheathed by the bearer 254 corresponding to position of the rotator 252 (as shown in FIG. 8). The stator 253 is located on the inner side of the rotator 252, and mainly structured by the elements, such as circuit board, silicon steel (or silicon lamination), and wiring set, etc. After the pump 25 is assembled with the base 21 correspondingly, the impeller 251 is accommodated in the pump accommodating groove 211, and the liquid draining hole 212 is arranged corresponding to and communicates with the liquid storage room 13.

Figure 5:
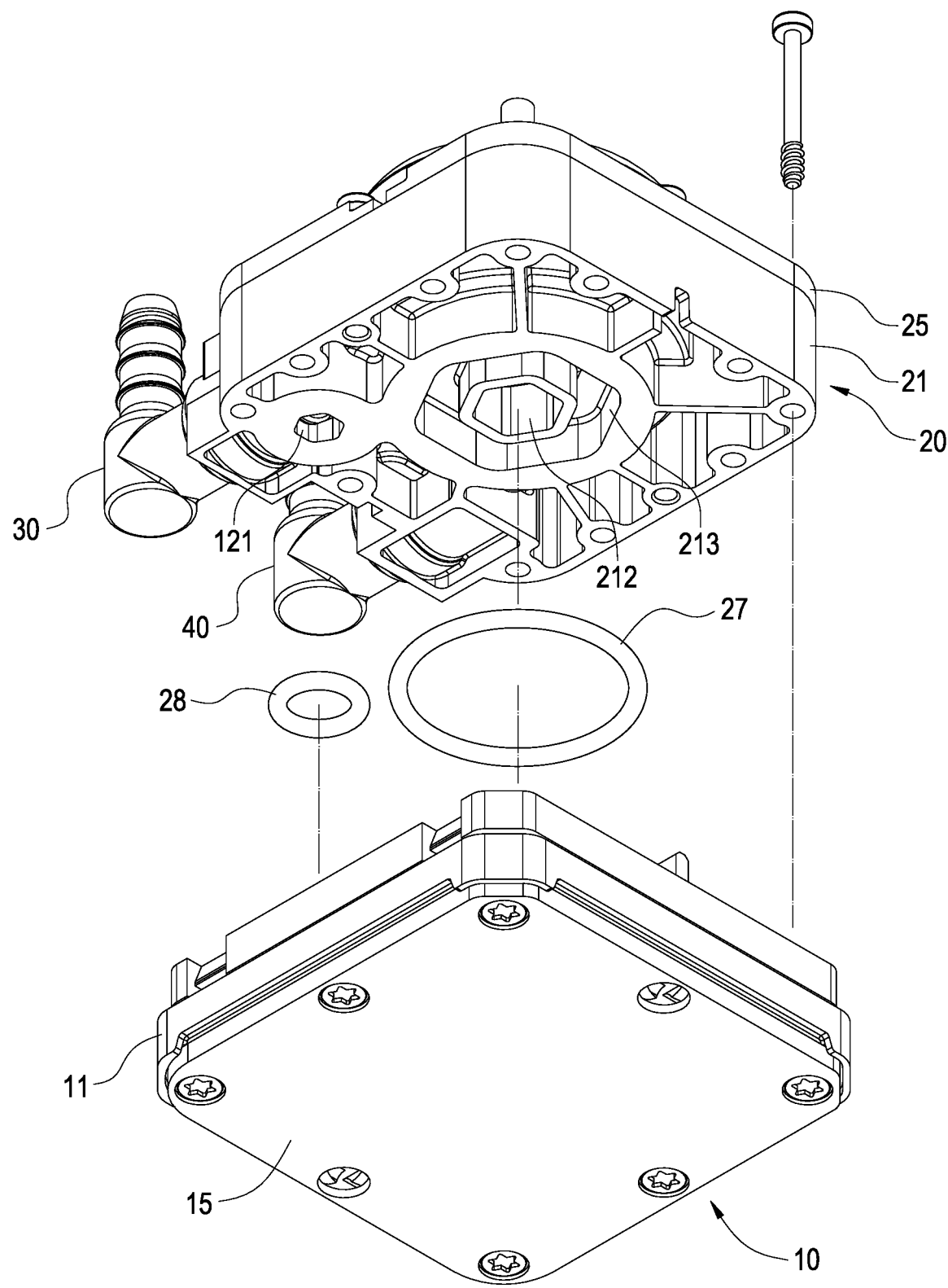
FIG. 5 is an exploded view along another direction of the liquid cooler and the pump assembly of the disclosure.

In some embodiments, a liquid retaining room 213 (as shown in FIG. 5) is defined on an outer periphery of the liquid draining hole 212 of the base 21. The liquid retaining room 213 communicates with the liquid draining hole 212 and the liquid storage room 13 to provide liquid (or water) supplement.

Figure 3:
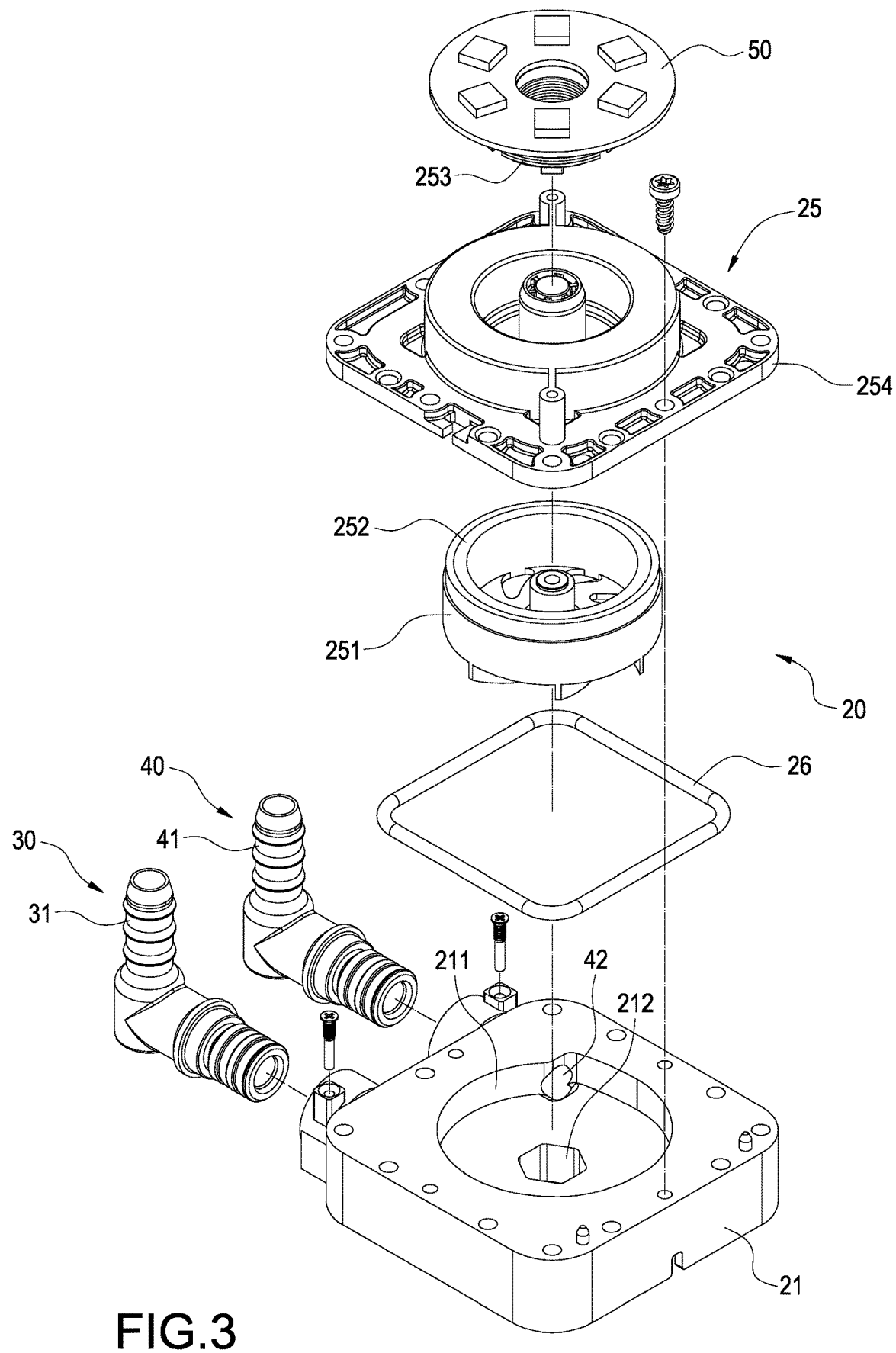
FIG. 3 is an exploded view of the pump assembly, the liquid input connector, and the liquid output connector of the disclosure.
Figure 4:
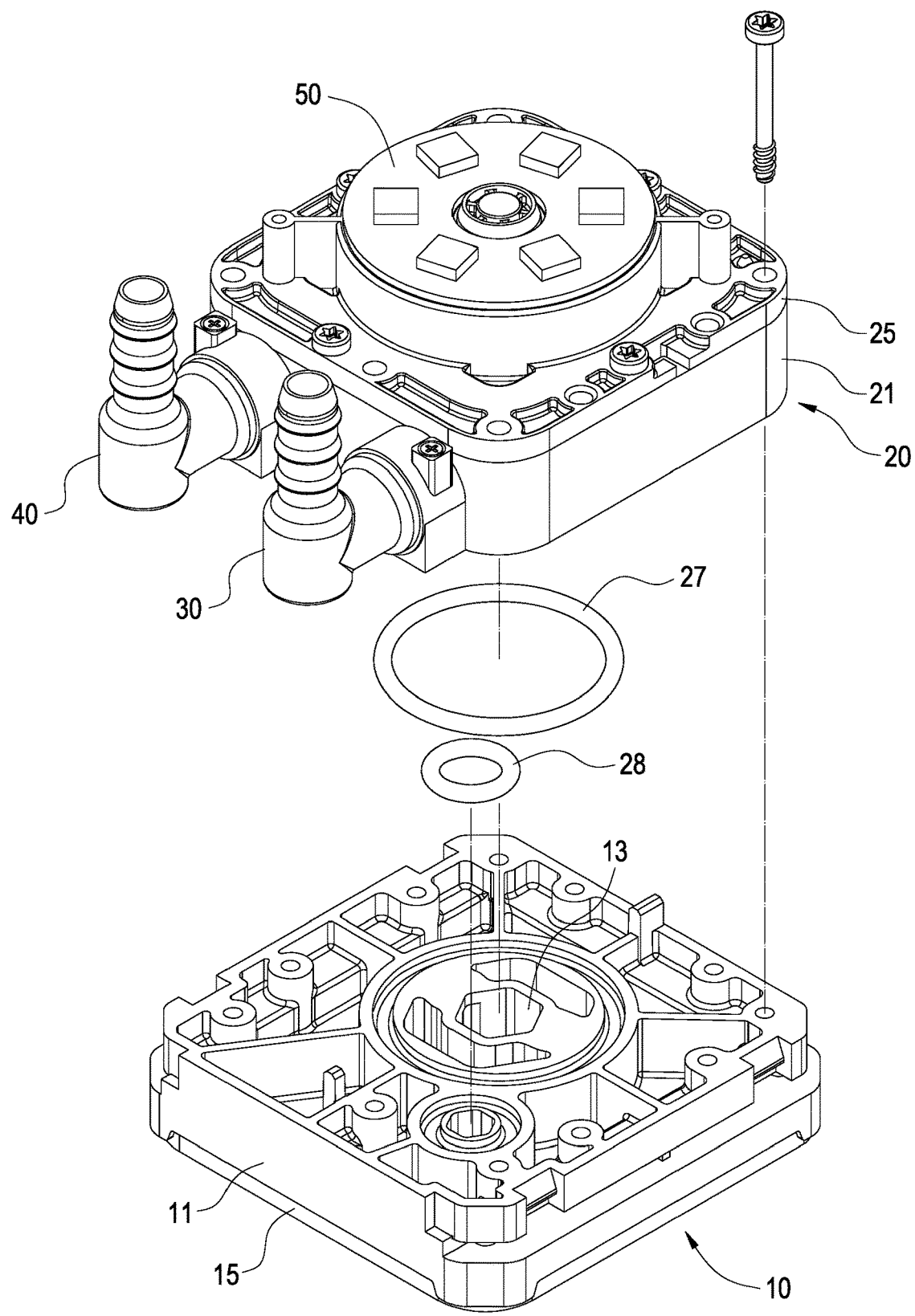
FIG. 4 is an exploded view of the liquid cooler and the pump assembly of the disclosure.

In some embodiments, the liquid-cooling heat dissipation device 1 further includes a first sealing element 26 (as shown in FIG. 3), a second sealing element 27, and a third sealing element 28 (as shown in FIG. 4 and FIG. 5). The first sealing element 26 is sandwiched between the bearer 254 and the base 21 (as shown in FIG. 8). The second sealing element 27 is sandwiched between the upper casing 111 and the base 21 (as shown in FIG. 8). The third sealing element 28 is sandwiched between the seat 11 and the base 21 (as shown in FIG. 5).

Figure 9:
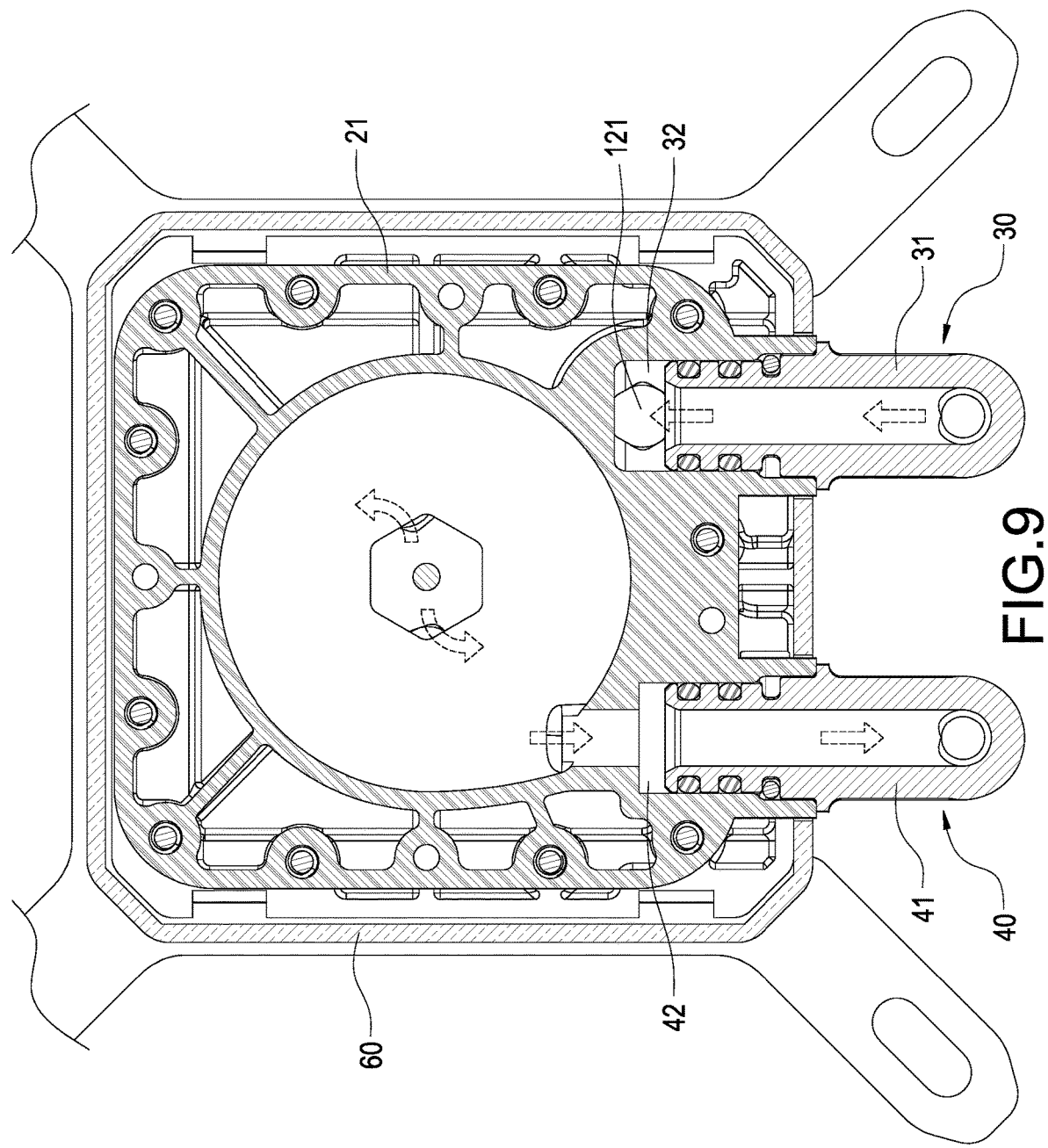
FIG. 9 is a cross-sectional view along 9-9 in FIG. 8.
Figure 10:
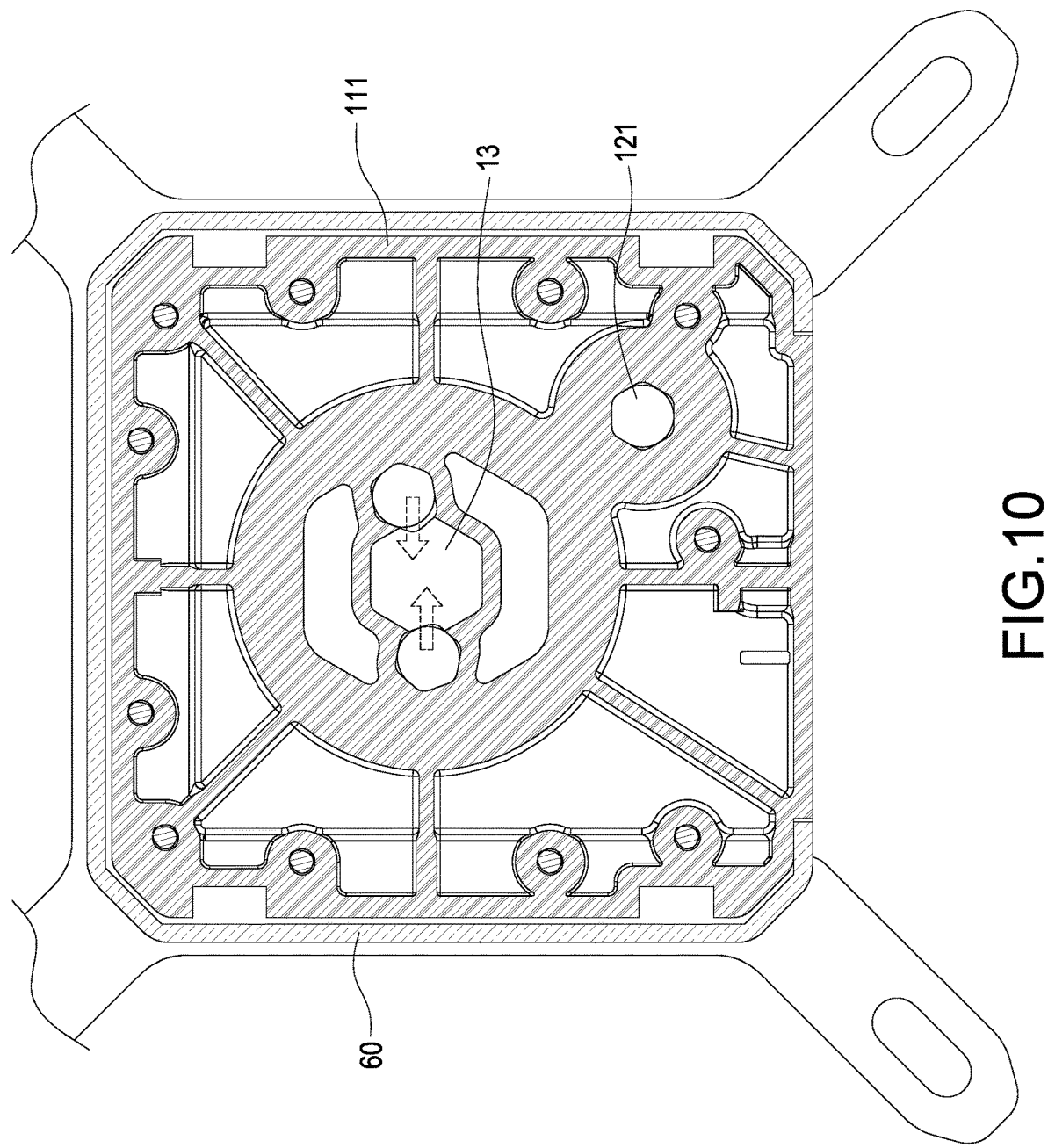
FIG. 10 is a cross-sectional view along 10-10 in FIG. 8.
Figure 11:
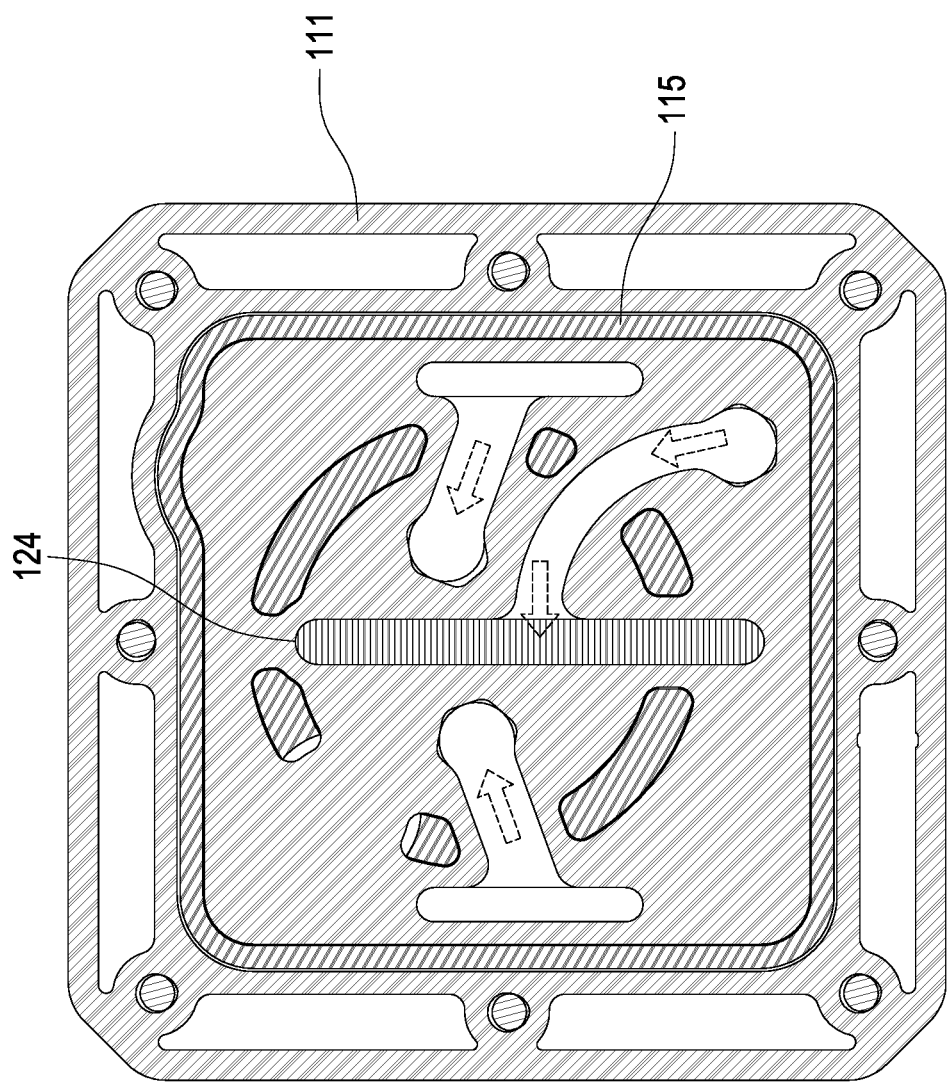
FIG. 11 is a cross-sectional view along 11-11 in FIG. 8.
Figure 12:
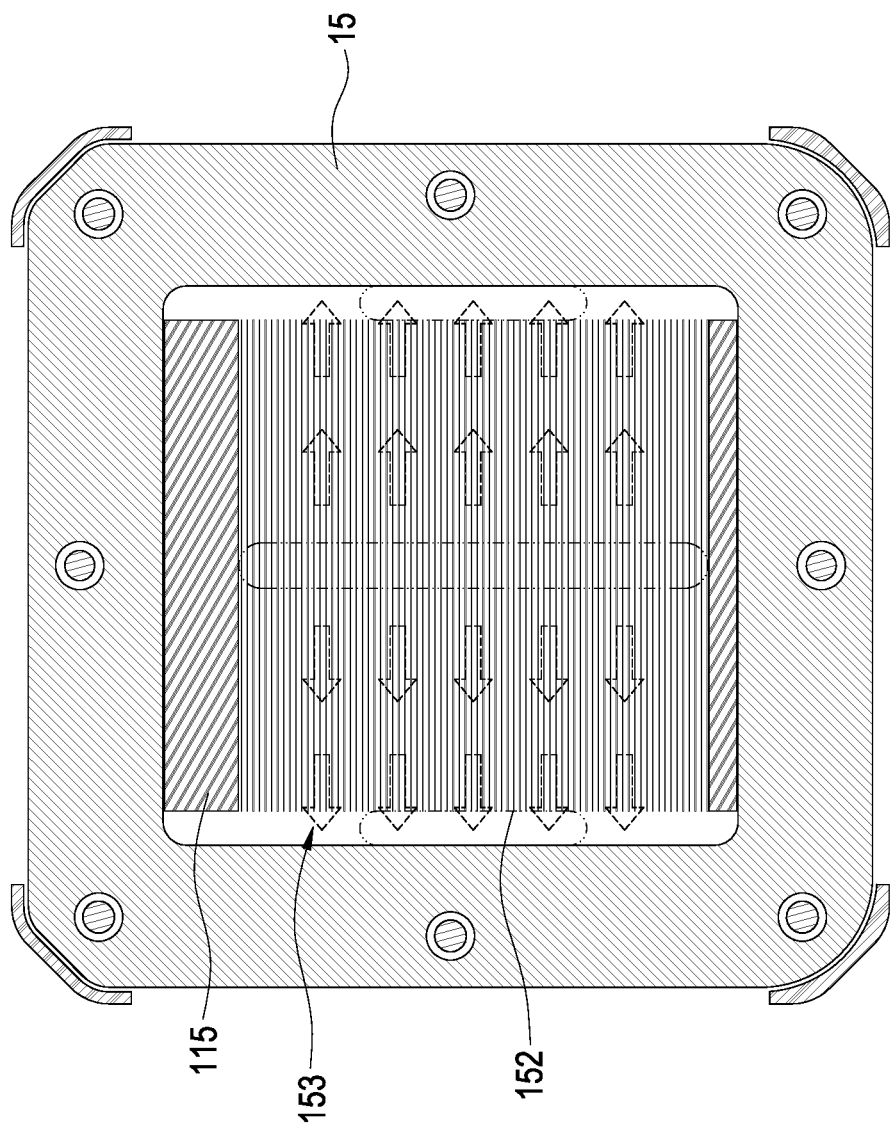
FIG. 12 is a cross-sectional view along 12-12 in FIG. 8.

The liquid input connector 30 mainly includes a liquid input head 31 and a liquid input hole 32 communicating with the liquid input head 31 (as shown in FIG. 9). The liquid input head 31 is fixed on a side of the base 21. The liquid input hole 32 communicates with the liquid input channel 121.

The liquid output connector 40 mainly includes a liquid output head 41 and a liquid output hole 42 communicating with the liquid output head 41 (as shown in FIG. 9). The liquid output head 41 is fixed on a side of the base 21. The liquid output hole 42 communicates with the liquid output hole 128 of the liquid output channel 125.

Figure 6:
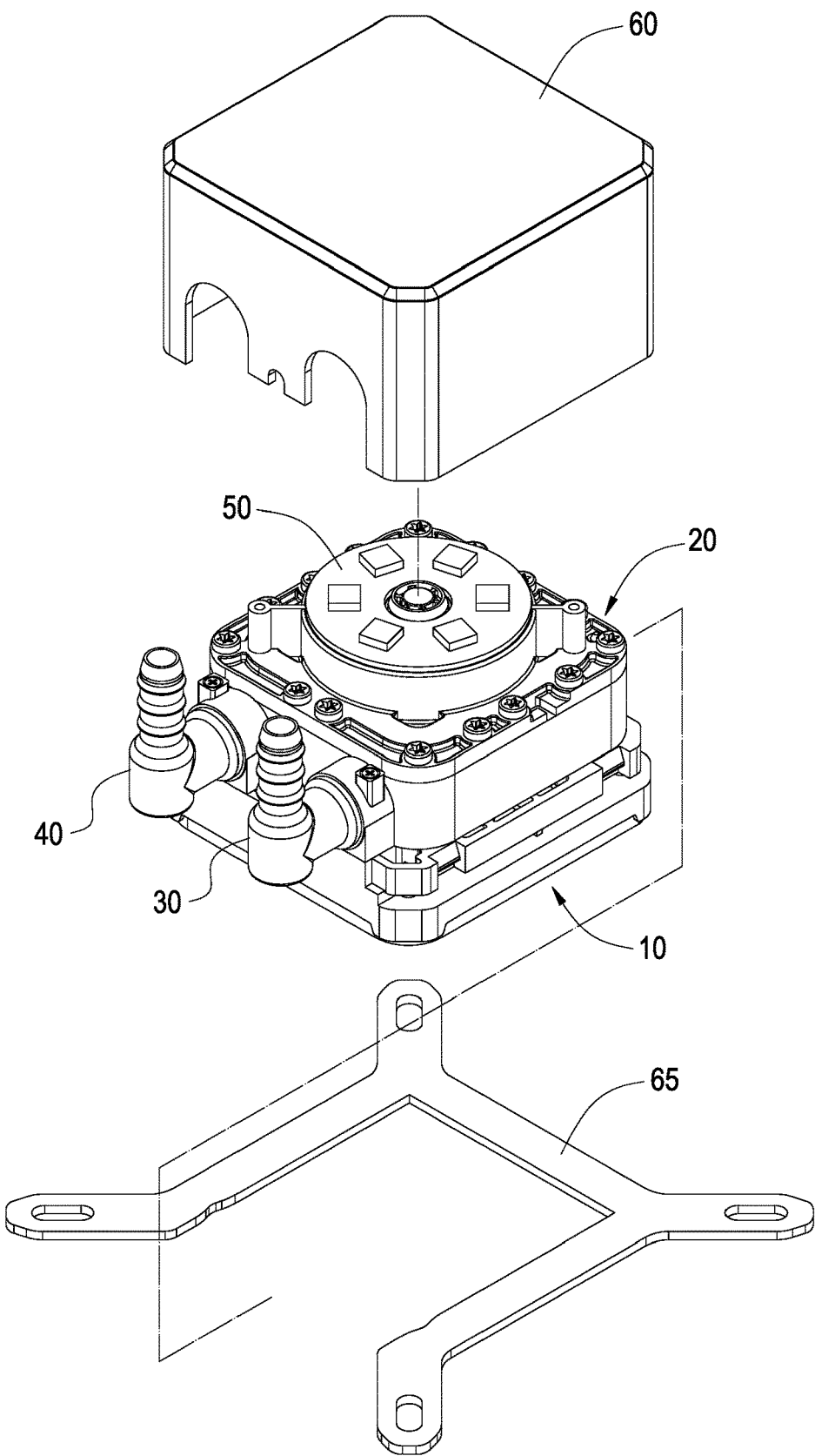
FIG. 6 is an exploded view of the cover and the fixing frame of the disclosure.
Figure 7:
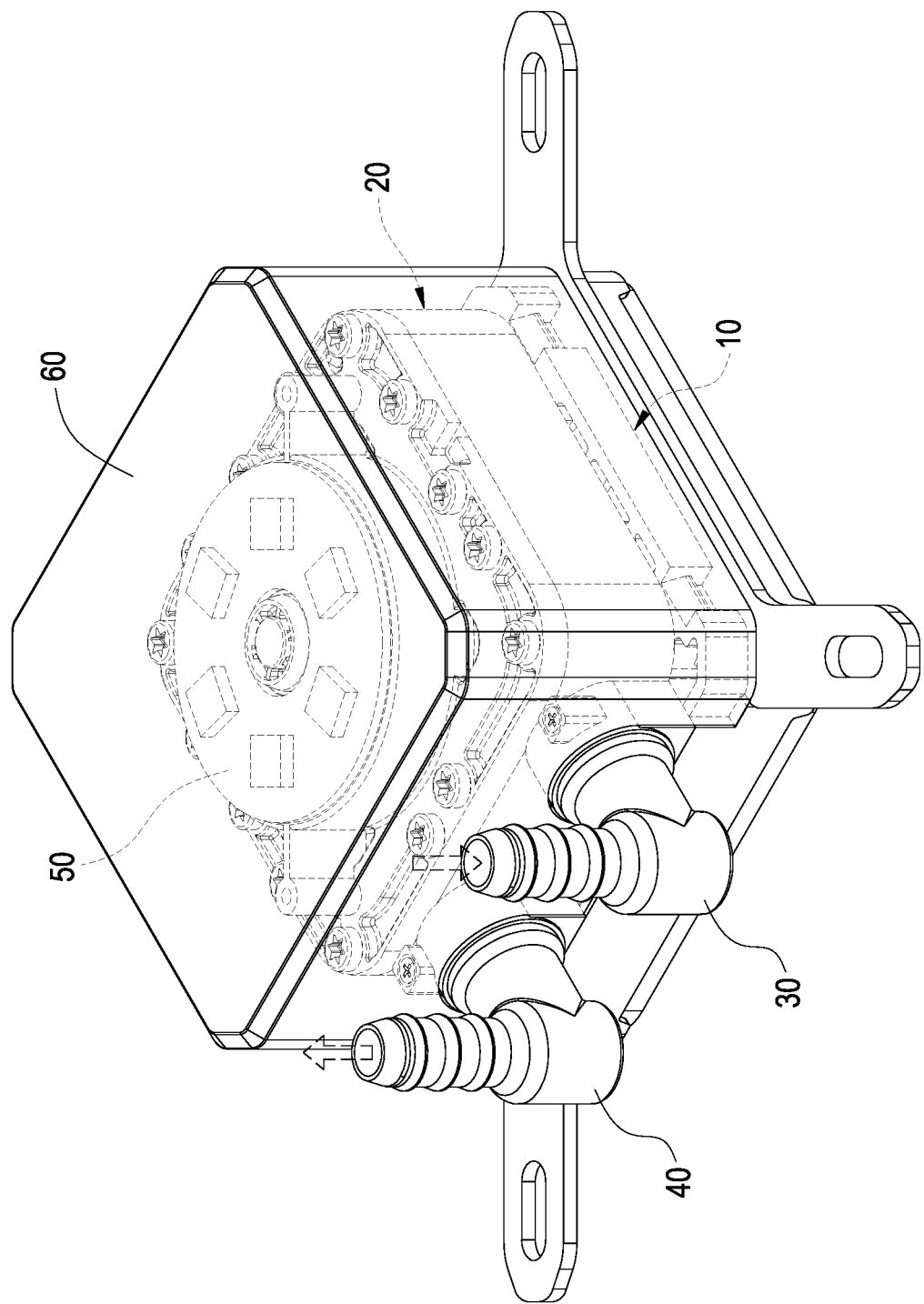
FIG. 7 is an assembled perspective view of the liquid-cooling heat dissipation device of the disclosure.

Referring to FIG. 6 and FIG. 7, in some embodiments, the liquid-cooling heat dissipation device 1 further includes a lighting board 50 fixed on and electrically connected with the pump 25. The lighting board 50 mainly includes circuit board and a plurality of light emitting elements. The light emitting elements are disposed on the circuit board for displaying the related mechanism, such as the operation of the liquid-cooling heat dissipation device 1, etc., by turning on/off or twinkling.

In some embodiments, the liquid-cooling heat dissipation device 1 further includes a cover 60 and a fixing frame 65. The cover 60 covers the seat 10 correspondingly, and may be an element made by a light permeable material. The fixing frame 65 is assembled with the seat 10 correspondingly to be located below the cover 60.

Referring to FIG. 7 to FIG. 12, when being used, the working liquid, such as water, etc., is input from the liquid input head 31, sequentially flows through the liquid input hole 122 of the liquid input channel 121, the first liquid input passage 123, and the second liquid input passage 124 to enter the heat exchanging chamber 153 of the heat absorbing structure 15 to perform the heat exchanging with the heat dissipation fins 152, and brings out the heat from the heat dissipation fins 152. Thereafter, the working liquid sequentially flows through the liquid output grooves 126 of the liquid output channel 125, the first liquid output passage 127, the liquid output hole 128, the liquid storage room 13, the liquid draining hole 212, and the pump accommodating groove 211 to be transmitted toward the direction of the liquid output hole 42 and the liquid output head 41 through the impeller 251 of the pump 25. The working liquid with high heat is cooled down through the liquid cooling composition 7 by using the liquid conduit 8, thereby providing for next circulation operation.

While this disclosure has been described by means of specific embodiments, numerous modifications and variations may be made thereto by those skilled in the art without departing from the scope and spirit of this disclosure set forth in the claims.

What is claimed is:

1. A liquid-cooling heat dissipation device, comprising:
  a liquid cooler, comprising a seat and a heat absorbing structure connected with the seat, the heat absorbing structure comprising a heat exchanging chamber defined therein, and the seat comprising a liquid supplying channel communicating with the heat exchanging chamber, wherein a liquid storage room is defined in the liquid supplying channel;
  a pump assembly, comprising a base and a pump fixed on the base, the base flatly attached on the seat and comprising a pump accommodating groove and a liquid draining hole, and the pump comprising an impeller accommodated in the pump accommodating groove, wherein the liquid draining hole is defined corresponding to and communicates with the liquid storage room;
  a liquid input connector, disposed on the base and communicating with the liquid supplying channel; and
  a liquid output connector, disposed on the base and communicating with the pump accommodating groove;
  wherein the seat comprises an upper casing and a bottom casing assembled with the upper casing correspondingly, and the liquid supplying channel is defined inside the upper casing and the bottom casing;
  wherein the liquid supplying channel comprises a liquid input channel, and the liquid input channel comprises a liquid input hole defined on the upper casing, a first liquid input passage communicating with the liquid input hole and defined between the upper casing and the bottom casing, and a second liquid input passage communicating with the first liquid input passage and defined on the bottom casing;
  wherein the liquid supplying channel comprises a liquid output channel, and the liquid output channel comprises a plurality of liquid output grooves defined on the bottom casing, a plurality of first liquid output passages respectively communicating with the liquid output grooves and defined between the upper casing and the bottom casing, and a plurality of liquid output holes respectively communicating with the first liquid output passages and defined on the upper casing.

2. The liquid-cooling heat dissipation device according to claim 1, wherein the base comprises a liquid retaining room defined on an outer periphery of the liquid draining hole, and the liquid retaining room communicates with the liquid draining hole and the liquid storage room.

3. The liquid-cooling heat dissipation device according to claim 2, further comprising a first sealing element, and the pump comprising a bearer fixed to the base correspondingly, wherein the first sealing element is sandwiched between the bearer and the base.

4. The liquid-cooling heat dissipation device according to claim 3, further comprising a second sealing element, wherein the second sealing element is sandwiched between the upper casing and the base.

5. The liquid-cooling heat dissipation device according to claim 3, further comprising a third sealing element sandwiched between the seat and the base.

6. The liquid-cooling heat dissipation device according to claim 1, further comprising a lighting board fixed on and electrically connected with the pump.

7. The liquid-cooling heat dissipation device according to claim 1, wherein the liquid storage room communicates with the liquid output holes and is defined on a middle portion of the upper casing.

* * * * *